United States Patent
Chen

(10) Patent No.: US 9,004,755 B2
(45) Date of Patent: Apr. 14, 2015

(54) TEMPERATURE SENSOR USING DELAY CIRCUIT

(75) Inventor: Shi-Wen Chen, Kaohsiung (TW)

(73) Assignee: United Microelectronics Corporation, Hsinchu (TW)

( * ) Notice: Subject to any disclaimer, the term of this patent is extended or adjusted under 35 U.S.C. 154(b) by 450 days.

(21) Appl. No.: 13/555,190

(22) Filed: Jul. 23, 2012

(65) Prior Publication Data

US 2014/0023113 A1    Jan. 23, 2014

(51) Int. Cl.
*G01K 7/00*    (2006.01)
*G01K 7/01*    (2006.01)
*H03K 3/03*    (2006.01)

(52) U.S. Cl.
CPC ............... *G01K 7/01* (2013.01); *H03K 3/0315* (2013.01)

(58) Field of Classification Search
CPC .................................... H03K 3/0315
USPC .............................. 374/163, 170, 171; 331/57
See application file for complete search history.

(56) References Cited

U.S. PATENT DOCUMENTS

| | | | |
|---|---|---|---|
| 4,758,821 A * | 7/1988 | Nelson et al. | 341/157 |
| 4,988,960 A * | 1/1991 | Tomisawa | 332/127 |
| 5,159,205 A | 10/1992 | Gorecki et al. | |
| 5,899,570 A | 5/1999 | Darmawaskita et al. | |
| 6,081,146 A | 6/2000 | Shiochi et al. | |
| 6,246,271 B1 | 6/2001 | Takada et al. | |
| 6,285,578 B1 | 9/2001 | Huang | |
| 6,427,226 B1 | 7/2002 | Mallick et al. | |
| 6,617,936 B2 * | 9/2003 | Dally et al. | 331/57 |
| 6,625,077 B2 | 9/2003 | Chen | |
| 6,653,868 B2 | 11/2003 | Oodaira et al. | |
| 6,668,358 B2 | 12/2003 | Friend et al. | |
| 6,795,001 B2 | 9/2004 | Roza | |
| 6,847,572 B2 | 1/2005 | Lee et al. | |
| 7,497,615 B2 | 3/2009 | Kim et al. | |
| 7,772,915 B2 * | 8/2010 | Kim | 327/512 |
| 7,961,033 B2 | 6/2011 | Meninger et al. | |
| 2007/0160114 A1 | 7/2007 | Kim | |
| 2008/0069176 A1 | 3/2008 | Pertijs et al. | |
| 2008/0189662 A1 | 8/2008 | Nandy et al. | |
| 2010/0124251 A1 | 5/2010 | Peterson et al. | |
| 2010/0189160 A1 * | 7/2010 | Kim et al. | 374/170 |

* cited by examiner

*Primary Examiner* — Lisa Caputo
*Assistant Examiner* — Nasir U Ahmed
(74) *Attorney, Agent, or Firm* — Ding Yu Tan

(57) ABSTRACT

A temperature sensor includes a signal delaying apparatus, a comparison apparatus, a multiplier and a counting apparatus. The signal delaying apparatus is configured to receive a step signal, perform a phase delay operation on the received step signal according to a temperature degree, and thereby forming a first output signal. The comparison apparatus is configured to receive the first output signal and the step signal, and accordingly output a second output signal. The multiplier is configured to receive the second output signal and a clock signal, and accordingly output a third output signal. The counting apparatus is configured to receive the third output signal, count the number of pulses of the third output signal, and generate a digital code accordingly.

14 Claims, 5 Drawing Sheets

US 9,004,755 B2

TEMPERATURE SENSOR USING DELAY CIRCUIT

FIELD OF THE INVENTION

The present invention relates to a temperature sensor, and more particularly to a temperature sensor implemented based on a signal delaying apparatus.

BACKGROUND OF THE INVENTION

The current conventional temperature sensors basically have a complex design, large circuit size and high power consumption issues. For example, a temperature sensor, commonly seen in market and constituted by a proportional-to-absolute-temperature (PTAT) source, a bandgap voltage reference and an analog-to-digital converter, has a complex design, a large circuit size and consumes more power.

SUMMARY OF THE INVENTION

Therefore, an object of the present invention is to provide a temperature sensor implemented based on a signal delaying apparatus, which has a simpler design, smaller circuit size and lower power consumption.

An embodiment of the present invention provides a temperature sensor, which includes a signal delaying apparatus, a comparison apparatus, a multiplier and a counting apparatus. The signal delaying apparatus is configured to receive a step signal, perform a phase delay operation on the received step signal according to a temperature degree, and thereby forming a first output signal. The comparison apparatus has a first input terminal, a second input terminal and a first output terminal. The first input terminal is configured to receive the first output signal; the second input terminal is configured to receive the step signal; and the first output terminal is configured to output a second output signal. The multiplier has a third input terminal, a fourth input terminal and a second output terminal. The third input terminal is configured to receive the second output signal; the fourth input terminal is configured to receive a clock signal; and the second output terminal is configured to output a third output signal. The counting apparatus is configured to receive the third output signal, count the number of pulses of the third output signal, and generate a digital code accordingly.

In summary, the temperature sensor according to the present invention is digitalized through being implemented by a signal delaying apparatus, a comparison apparatus, a multiplier and a counting apparatus; wherein the signal delaying apparatus can modulate the phase of its received signal according to a temperature degree. In one embodiment of the present invention, the signal delaying apparatus is configured to receive a step signal and perform a phase delay operation on the received step signal according to a temperature degree. The comparison apparatus is configured to receive the step signal and an output signal from the signal delaying apparatus, and correspondingly generate an output signal with a pulse; wherein the phase is configured to have a pulse-enable time equal to the total phase delay time of the output signal of the signal delaying apparatus. The multiplier is configured to receive the output signal of the signal delaying apparatus and a clock signal, and correspondingly generate an output signal with a plurality of pulses; wherein the pluses of these pulses are located within the pulse-enable time of the pulse of the output signal outputted from the comparison apparatus. The counting apparatus is configured to count the number of pulses of the output signal outputted from the multiplier and generate a digital code accordingly. Because being designed by a digital mean, the temperature sensor according to the present invention can have simpler design, smaller circuit size and less power consumption.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
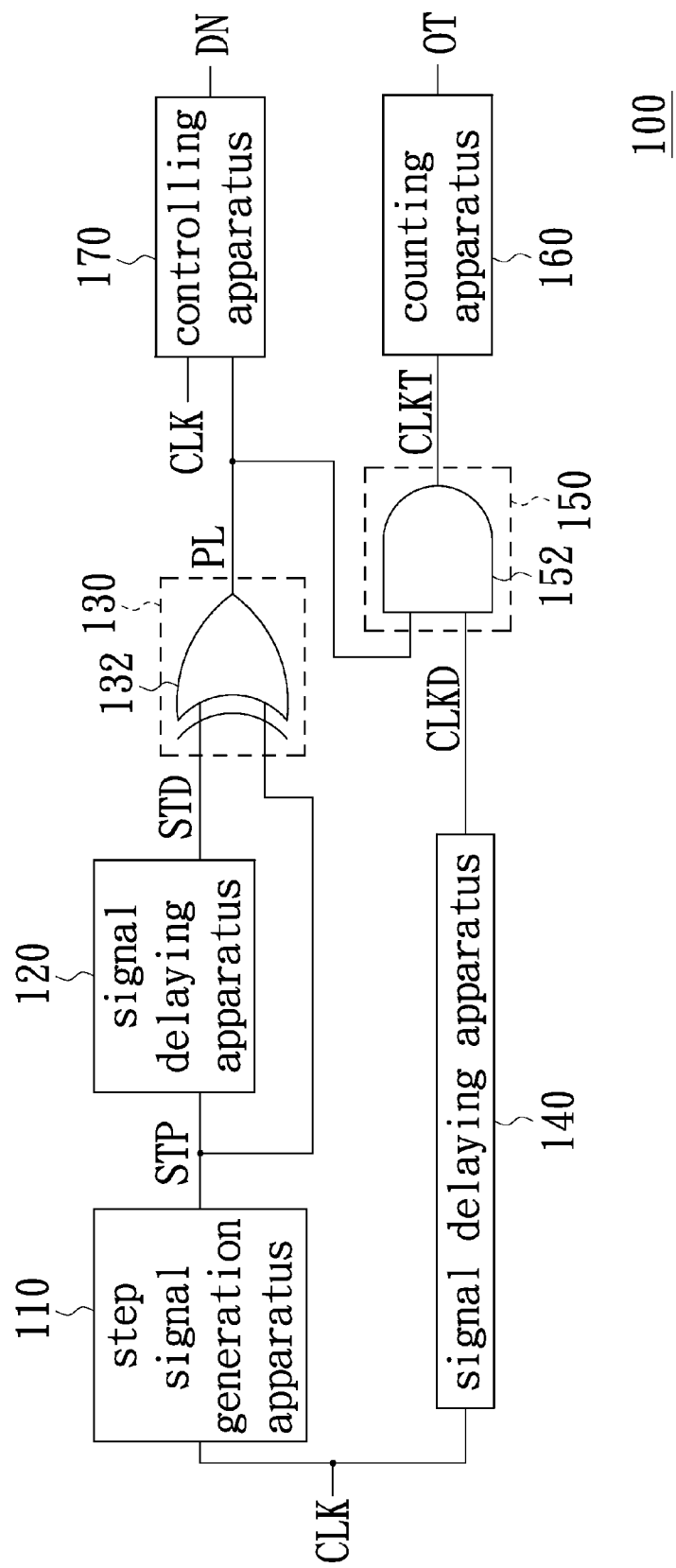
FIG. 1 is a schematic circuit block view of a temperature sensor in accordance with an embodiment of the present invention.
Figure 2:
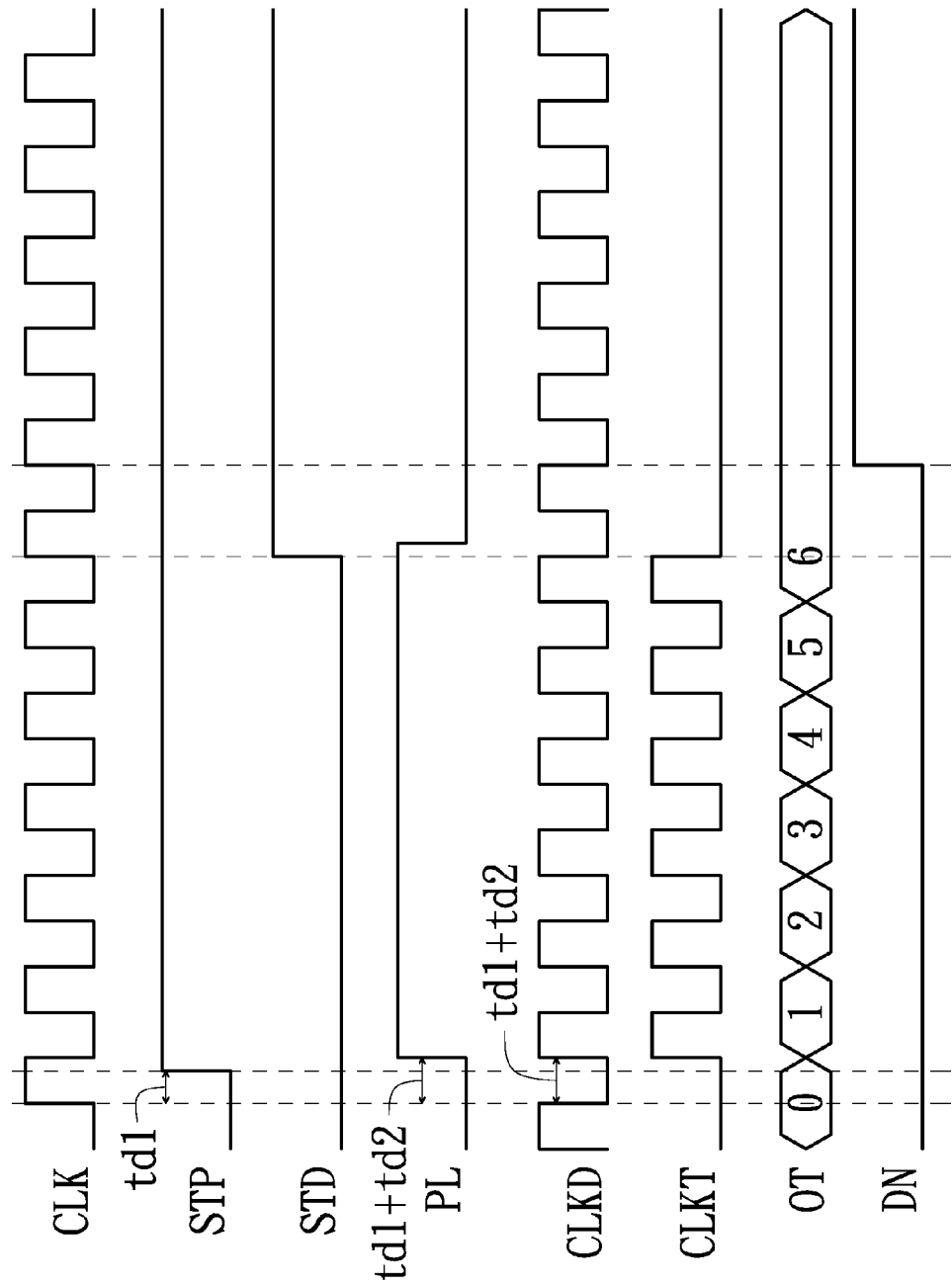
FIG. 2 is a timing sequence view of signals associated with the temperature sensor depicted in FIG. 1.

FIG. 1 is a schematic circuit block view of a temperature sensor in accordance with an embodiment of the present invention. FIG. 2 is a timing sequence view of signals associated with the temperature sensor depicted in FIG. 1. Please refer to FIGS. 1 and 2. The temperature sensor 100 in this embodiment includes a step signal generation apparatus 110, two signal delaying apparatuses 120, 140, a comparison apparatus 130, a multiplier 150, a counting apparatus 160 and a controlling apparatus 170. The step signal generation apparatus 110 is configured to receive a clock signal CLK and accordingly generate a step signal STP; wherein the step signal STP has, due to the step signal generation apparatus 110, a phase delay td1 relative to the clock signal CLK. The signal delaying apparatus 120 is configured to receive the step signal STP, perform a phase delay operation on the received step signal STP according to a temperature degree and accordingly output an output signal STD. In other words, the signal delaying apparatus 120 can modulate the received step signal STP to have a specific phase delay in response to a specific temperature degree.

The comparison apparatus 130 has two input terminals, to which the output signal STD from the signal delaying apparatus 120 and the step signal STP are supplied respectively, and one output terminal, from which an output signal PL is outputted; wherein the output signal PL has, due to the comparison apparatus 130, a phase delay td2 relative to the step signal STP. In this embodiment, the comparison apparatus 130 is configured to perform an exclusive-or (XOR) logic operation on the two received signals. That is, the comparison apparatus 130 outputs a logic-low output signal PL if the output signal STD and the step signal STP, simultaneously supplied into the two input terminals of the comparison apparatus 130, have the same logic level; alternatively, the comparison apparatus 130 outputs a logic-high output signal PL if the output signal STD and the step signal STP have different logic levels. In addition, as illustrated in FIG. 2, it is to be noted that the output signal PL has a pulse, and the pulse-enable time of the pulse represents the total delay time of the step signal STP delayed by the signal delaying apparatus 120 according to a temperature degree.

Accordingly, it is understood that the comparison apparatus 130 is configured to perform an XOR logic operation on the two signals supplied therein, and the comparison apparatus 130 can be implemented by an XOR logic operation apparatus. In this embodiment, the XOR logic operation apparatus can be implemented by an XOR gate 132, and no limitation. As such, the two input terminals of the XOR gate 132 are referred to as the two input terminals of the comparison apparatus 130, and the output terminal of the XOR gate 132 is referred to as the output terminal of the comparison apparatus 130.

Additionally, in order to use the clock signal CLK for counting the pulse-enable time of the output signal PL more accurately, the signal delaying apparatus 140 is configured to perform a phase delay operation on the received clock signal CLK and thereby outputting a clock signal CLKD for the counting of the pulse-enable time of the output signal PL. In other words, the rising edge of one pulse of the clock signal CLKD is configured to be correspondingly located at the rising edge of the pulse of the output signal PL. Specifically, the clock signal CLKD is, due to the signal delaying apparatus 140, configured to have a phase delay equal to that provided by the step signal generation apparatus 110 (that is, td1) adding to that provided by the comparison apparatus 130 (that is, td2). Thus, the output signal PL and the clock signal CLKD can have an equal delay time (td1+td2) relative to the clock signal CLK; and accordingly, the rising edge of the pulse in the output signal PL can be exactly indicated by a rising edge of one pulse in the clock signal CLKD. Therefore, the pulse-enable time of the output signal PL can be counted more accurately by using the clock signal CLKD.

The multiplier 150 has two input terminals, to which the output signal PL from the comparison apparatus 130 and the clock signal CLKD from the signal delaying apparatus 140 are supplied respectively, and one output terminal, from which an output signal CLKT is outputted. In this embodiment, the multiplier 150 outputs a logic-low output signal CLKT if at least one of the output signal PL and the clock signal CLKD, simultaneously supplied into the two input terminals of the multiplier 150, having a logic-low level; alternatively, the multiplier 150 outputs a logic-high output signal CLKT if the output signal PL and the clock signal CLKD both having a logic-high level. In addition, as illustrated in FIG. 2, the output signal CLKT includes a plurality of pulses, and these pulses are located within the pulse-enable time of the output signal PL.

Accordingly, it is understood that the multiplier 150 is configured to perform an AND logic operation on the two signals supplied therein, and the multiplier 150 can be implemented by an AND logic operation apparatus, which may be realized by an AND gate 152 in this embodiment, and no limitation. As such, the two input terminals of the AND gate 152 are referred to as the two input terminals of the multiplier 150, and the output terminal of the AND gate 152 is referred to as the output terminal of the multiplier 150.

The counting apparatus 160 is configured to receive the clock signal CLKT from the multiplier 150, count the number of pulses of the clock signal CLKT and output a digital code OT accordingly. And thus, the back-end circuit (not shown) associated with the temperature sensor 100 can determine the current temperature degree based on the digital code OT outputted from the counting apparatus 160.

Additionally, in order to determine the length of the digital code OT so that the back-end circuit can determine the current temperature degree according to the length of the digital code OT, the controlling apparatus 170 in the temperature sensor 100 is configured to output a completion signal DN for indicating the end of the digital code OT; wherein the controlling apparatus 170 generates the completion signal DN according to the received clock signal CLK and the output signal PL from the comparison apparatus 130. Specifically, as illustrated in FIG. 2, the controlling apparatus 170 is configured to detect an occurrence of the falling edge of the pulse of the output signal PL by the rising edges of the pulses of the clock signal CLK. Once the aforementioned falling edge is detected, the controlling apparatus 170 then converts the completion signal DN from logic-low to logic-high so as to indicate the end of the digital code OT. In response to another design requirement, it is understood that the controlling apparatus 170 may be configured to convert the completion signal DN from logic-high to logic-low if the aforementioned falling and rising edges both are detected.

Through being completely implemented in a digital manner, the temperature sensor 100 according to the present invention can have a simpler circuit design, smaller circuit size and less power consumption. In addition, according to the aforementioned descriptions, the temperature sensor 100 can have a more-precise operation by employing the signal delaying apparatus 140 and the associated back-end circuit can have a more-precise operation by employing the controlling apparatus 170. However, it is understood that the temperature sensor 100 can be implemented without the signal delaying apparatus 140 and the controlling apparatus 170 in another embodiment in response to another design requirement; as such, the multiplier 150 is, instead of being supplied with the clock signal CLKD, configured to be supplied with the clock signal CLK through one input terminal thereof if the signal delaying apparatus 140 is not employed. In addition, it is understood that the step signal STP in the temperature sensor 100 can be obtained from external source instead of being generated by the step signal generation apparatus 110; correspondingly, the signal delaying apparatus 140 is configured to have a phase delay equal to that of the comparison apparatus 130 only, so that the rising edge of one pulse of the clock signal CLKD is correspondingly located at the rising edge of the pulse of the output signal PL.

Figure 3:
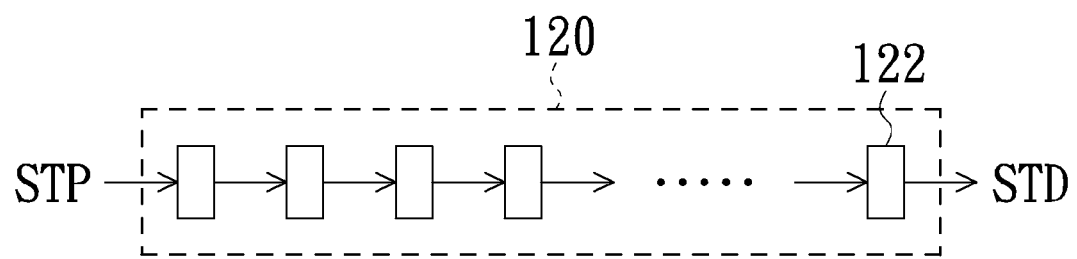
FIG. 3 is a schematic view illustrating one circuit design of the signal delaying apparatus depicted in FIG. 1.

FIG. 3 is a schematic view illustrating the circuit design of the temperature-dependence signal delaying apparatus 120. As shown, the signal delaying apparatus 120 includes a plurality of cascaded signal delaying units 122. Specifically, the first-stage signal delaying unit 122 is configured to receive the step signal STP, and the last-stage one is configured to output the output signal STD. In addition, it is to be noted that each of the signal delaying units 122 is configured to perform a phase delay operation on its received signal.

Figure 4:
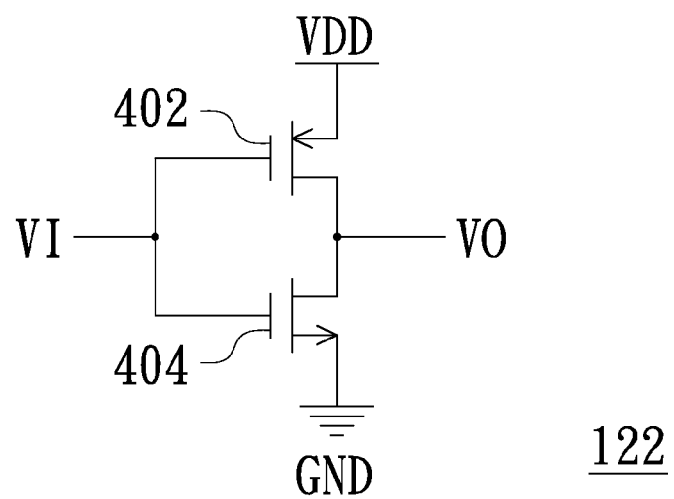
FIG. 4 is a schematic circuit view of a signal delaying unit.

Two exemplified circuit designs of the signal delaying unit 122 are described in the following. FIG. 4 is a schematic circuit view of the signal delaying unit 122. As shown, the signal delaying unit 122 is implemented by an inverter, which is constituted by a p-type transistor 402 and an n-type transistor 404. In this embodiment, the p-type transistor 402 and the n-type transistor 404 each can be implemented by a metal oxide semiconductor field effect transistor (MOSFET). Specifically, the p-type transistor 402 is configured to have its one source/drain electrically connected to a voltage source VDD; its another source/drain referred to as an output terminal of the inverter and from which an output signal VO is outputted;

and its gate referred to as an input terminal of the inverter and to which an input signal VI is inputted. The n-type transistor 404 is configured to have its one source/drain electrically connected to the output terminal of the inverter; its another source/drain electrically connected to a reference voltage (for example, electrically connected to ground GND); and its gate electrically connected to the input terminal of the inverter.

The delay time of the inverter in FIG. 4 can be expressed by the following two equations (1), (2):

$$t_{PHL} = \frac{2C_L V_{TN}}{K_N(VDD-V_{TN})^2} + \frac{C_L}{K_N(VDD-V_{TN})} \times \ln\left(\frac{1.5VDD-2V_{TN}}{0.5VDD}\right) \quad (1)$$

$$t_{PLH} = \frac{2C_L V_{TP}}{K_P(VDD+V_{TP})^2} + \frac{C_L}{K_P(VDD+V_{TP})} \times \ln\left(\frac{1.5VDD-2V_{TP}}{0.5VDD}\right) \quad (2)$$

wherein $t_{PHL}$ stands for a delay time of the inverter required for converting the input signal VI from logic-high into logic-low; $t_{PLH}$ stands for a delay time of the inverter required for converting the input signal VI from logic-low into logic-high; $C_L$ stands for a transconductance parameter and an effective load capacitance of the inverter, in other words, $C_L$ represents a loading; $V_{TH}$ stands for a threshold voltage of a n-type transistor; $V_{TP}$ stands for a threshold voltage of a p-type transistor; VDD is a value of a voltage source; $K_N = \mu_N C_{OX}(W/L)_N$; $KP = \mu_p C_{OX}(W/L)_p$. In addition, $\mu_N$ stands for a carrier mobility of an n-type transistor; $\mu_p$ for a carrier mobility of a p-type transistor; $C_{OX}$ stands for a gate oxide capacitance per unit area; $(W/L)_N$ stands for a ratio of width to length of a gate of an n-type transistor; $(W/L)_p$ stands for a ratio of width to length of a gate of a p-type transistor.

According to the equations (1), (2), the average delay time $t_P$ of the inverter depicted in FIG. 4 can be obtained by the following equation (3):

$$t_P = \frac{t_{PLH}+t_{PHL}}{2} = \frac{(L/W)C_L}{\mu C_{OX}(VDD-V_T)} \times \ln\left(\frac{1.5VDD-2V_T}{0.5VDD}\right) \quad (3)$$

In equation (3), because the carrier mobility $\mu$ and the threshold voltage $V_T$ both are inversely proportional to temperature degree, the carrier mobility $\mu$ and the threshold voltage $V_T$ each decreases, so that the average delay time $t_P$ of the inverter in FIG. 4 increases, with increasing temperature degree; alternatively, the carrier mobility $\mu$ and the threshold voltage $V_T$ each increases so that the average delay time $t_P$ of the inverter decreases, with decreasing temperature degree. Therefore, the inverter can modulate the phase delay degree of the input signal VI supplied therein according to a temperature degree. Moreover, it is to be noted that the number of the signal delaying units 122 in the signal delaying apparatus 120 must be even if each of the signal delaying units 122 is implemented by the aforementioned inverter as depicted in FIG. 4.

Figure 5:
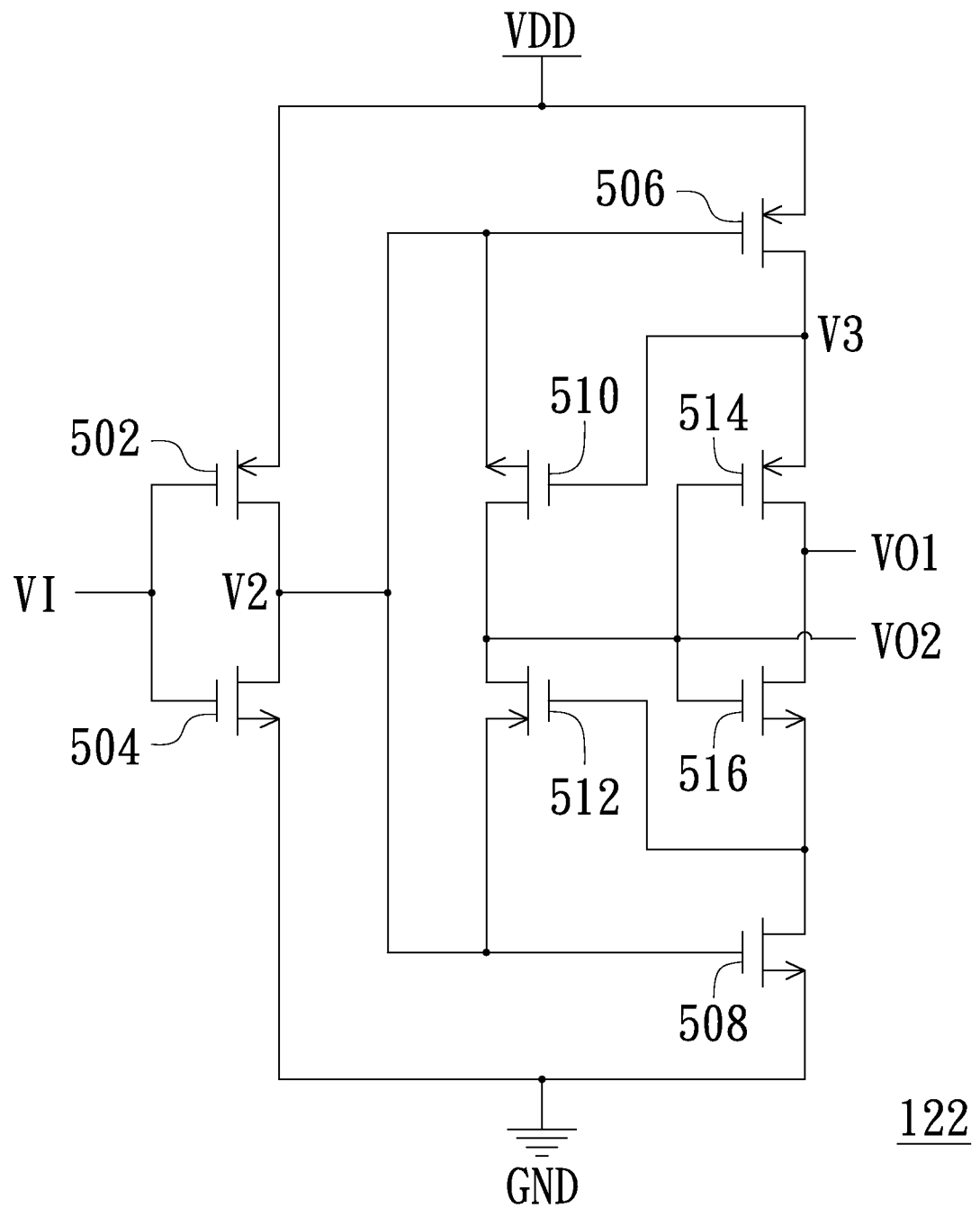
FIG. 5 is an alternative schematic circuit view of a signal delaying unit.

FIG. 5 is an alternative schematic circuit view of the signal delaying unit 122. As shown, the signal delaying unit 122 includes four p-type transistors 502, 506, 512 and 514 and four n-type transistors 504, 508, 510 and 516; wherein the aforementioned transistors each can be implemented by a metal oxide semiconductor field effect transistor. Specifically, the p-type transistor 502 is configured to have its one source/drain electrically connected to a voltage source VDD; and its gate referred to as an input terminal of the signal delaying unit 122 and to which an input signal VI is inputted. The n-type transistor 504 is configured to have its one source/drain electrically connected to another source/drain of the p-type transistor 502; its another source/drain electrically connected to a reference voltage (for example, electrically connected to ground GND); and its gate electrically connected to the input terminal of the signal delaying unit 122. The p-type transistor 506 is configured to have its one source/drain electrically connected to the voltage source VDD; and its gate electrically connected to another source/drain of the p-type transistor 502. The n-type transistor 508 is configured to have its one source/drain electrically connected to the reference voltage; and its gate electrically connected to another source/drain of the p-type transistor 502.

Moreover, the n-type transistor 510 is configured to have its one source/drain electrically connected to the gate of the p-type transistor 506; and its gate electrically connected to another source/drain of the p-type transistor 506. The p-type transistor 512 is configured to have its one source/drain electrically connected to another source/drain of the n-type transistor 510, its another source/drain electrically connected to the gate of the n-type transistor 508; and its gate electrically connected to another source/drain of the n-type transistor 508. The p-type transistor 514 is configured to have its one source/drain electrically connected to another source/drain of the p-type transistor 506; its another source/drain referred to as one output terminal of the signal delaying unit 122 and from which an output signal VO1 is outputted; and its gate electrically connected to another source/drain of the n-type transistor 510. The n-type transistor 516 is configured to have its one source/drain electrically connected to another source/drain of the p-type transistor 514; its another source/drain electrically connected to the gate of the p-type transistor 512; and its gate electrically connected to the gate of the p-type transistor 514 and another source/drain of the n-type transistor 510, and referred to as another output terminal of the signal delaying unit 122 and from which an output signal VO2 is outputted. In addition, the voltage source VDD in this embodiment is configured to have a value much greater than the threshold voltage $V_T$ of each aforementioned transistor.

In the signal delaying unit 122 as depicted in FIG. 5, the output signal VO1 and the input signal VI are configured to have a same phase; and the output signal VO2 and the input signal VI are configured to have a phase opposite to each other. Thus, the signal delaying unit 122 can function as a buffer if it is configured to have its output signal VO1 as an input signal of a next-stage signal delaying unit; alternatively, the signal delaying unit 122 can function as an inverter if it is configured to have its output signal VO2 as an input signal of a next-stage signal delaying unit. Moreover, it is to be noted that the number of the signal delaying units 122 in the signal delaying apparatus 120 must be even if the signal delaying units 122 each functioning as an inverter.

Based on the circuit depicted in FIG. 5, four average delay times $t_P$ associated with the signal delaying units 122 can be obtained by the following equations (4)~(7):

$$t_{P(V2-V1)} = \frac{t_{PLH}+t_{PHL}}{2} = \frac{(L/W)C_{L1}}{\mu C_{OX}(VDD-V_T)} \times \ln\left(\frac{1.5VDD-2V_T}{0.5VDD}\right) \quad (4)$$

$$t_{P(V3-V2)} = \frac{t_{PLH}+t_{PHL}}{2} = \frac{(L/W)C_{L2}}{\mu C_{OX}(VDD-V_T)} \times \ln\left(\frac{1.5VDD-2V_T}{0.5VDD}\right) \quad (5)$$

$$t_{P(VO2-V3)} = \frac{t_{PLH}+t_{PHL}}{2} = \frac{(L/W)C_{L3}}{\mu C_{OX}(VDD-V_T)} \times \ln\left(\frac{1.5VDD-2V_T}{0.5VDD}\right) \quad (6)$$

-continued $$t_{P(VO1-VO2)} = \frac{t_{PLH} + t_{PHL}}{2} = \frac{(L/W)C_{L4}}{\mu C_{OX}(VDD-V_T)} \times \ln\left(\frac{1.5VDD - 2V_T}{0.5VDD}\right) \quad (7)$$

wherein V2, V1, V3, VO2 and VO1 are designated in FIG. 5; VI is an input signal; VO1 and VO2 each is an output signal; $C_1$~$C_4$ each presents a loading.

Equation (8) can be derived from the aforementioned equations (4)~(7):

$$t_{P(VO1-V1)} = \qquad (8)$$
$$\frac{(L/W)}{\mu C_{OX}(VDD-V_T)} \times \ln\left(\frac{1.5VDD - 2V_T}{0.5VDD}\right) \times (C_{L1} + C_{L2} + C_{L3} + C_{L4})$$

Figure 6:
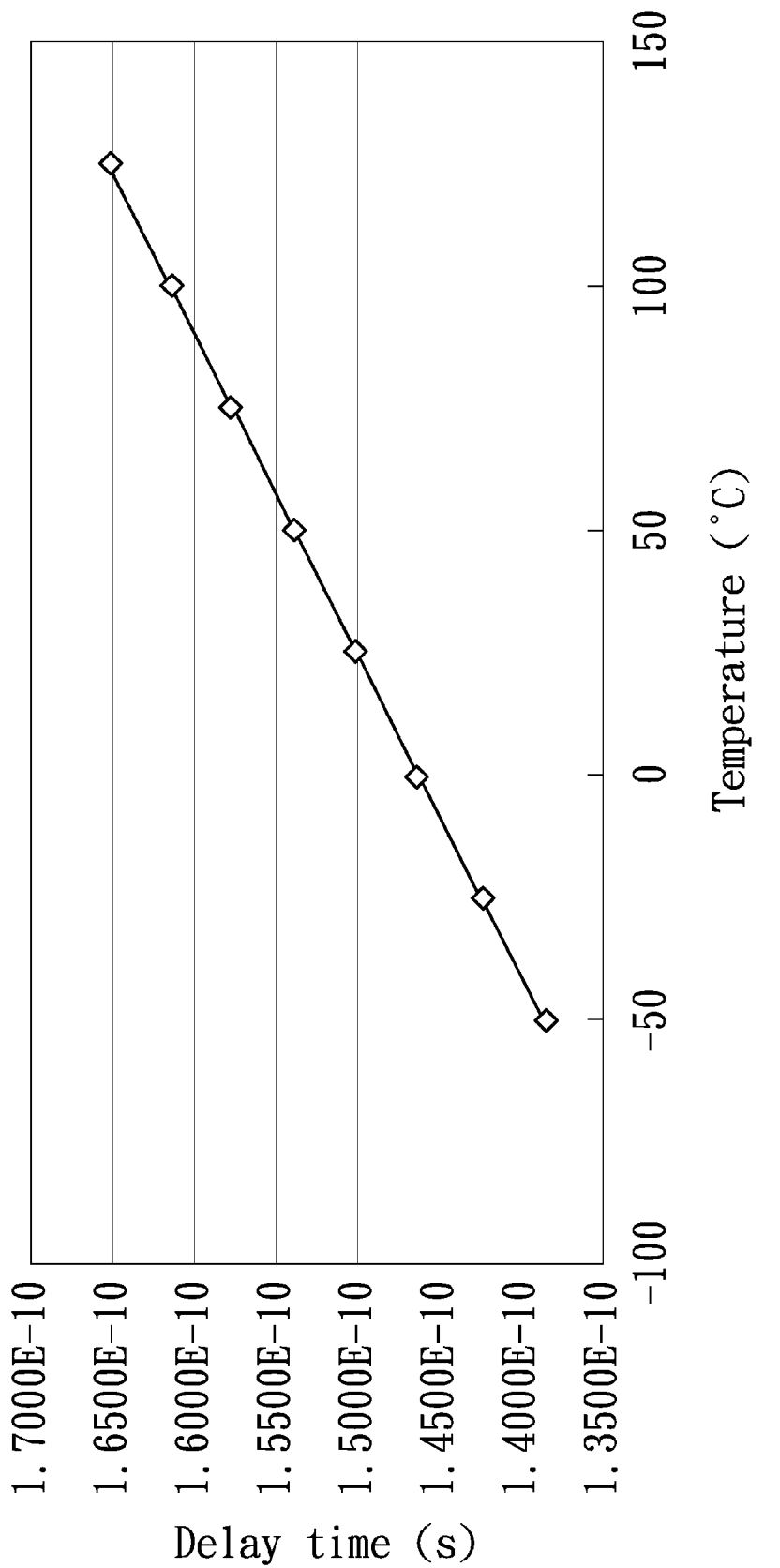
FIG. 6 is a schematic view illustrating the delay time and temperature relationship curve of the circuit depicted in FIG. 5 having a voltage source VDD of 1V.

In equation (8), because the carrier mobility μ and the threshold voltage $V_T$ both are inversely proportional to temperature degree, the carrier mobility μ and the threshold voltage $V_T$ each decreases, so that the average delay time $t_{p(VO1-VT)}$ of the signal delaying units 122 in FIG. 5 increases, with increasing temperature degree; alternatively, the carrier mobility μ and the threshold voltage $V_T$ each increases, so that the average delay time $t_{p(VO1-VT)}$ of the inverter decreases, with decreasing temperature degree. Therefore, the signal delaying unit 122 in FIG. 5 can modulate the phase delay degree of the input signal VI supplied therein according to a temperature degree. Specifically, the delay time and temperature relationship curve of the circuit in FIG. 5 is illustrated in FIG. 6; wherein the voltage source VDD of the circuit depicted in FIG. 5 is 1V, and the delay time is measured in seconds and the temperature is measured in ° C.

In summary, the temperature sensor according to the present invention is digitalized through being implemented by a signal delaying apparatus, a comparison apparatus, a multiplier and a counting apparatus; wherein the signal delaying apparatus can modulate the phase of its received signal according to a temperature degree. In one embodiment of the present invention, the signal delaying apparatus is configured to receive a step signal and perform a phase delay operation on the received step signal according to a temperature degree. The comparison apparatus is configured to receive the step signal and an output signal from the signal delaying apparatus, and correspondingly generate an output signal with a pulse; wherein the phase is configured to have a pulse-enable time equal to the total phase delay time of the output signal of the signal delaying apparatus. The multiplier is configured to receive the output signal of the signal delaying apparatus and a clock signal, and correspondingly generate an output signal with a plurality of pulses; wherein the pluses of these pulses are located within the pulse-enable time of the pulse of the output signal outputted from the comparison apparatus. The counting apparatus is configured to count the number of pulses of the output signal outputted from the multiplier and generate a digital code accordingly. Because being designed by a digital mean, the temperature sensor according to the present invention can have simpler design, smaller circuit size and less power consumption.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A temperature sensor, comprising:
    a first signal delaying apparatus configured to receive a step signal, perform a phase delay operation on the received step signal according to a temperature degree, and thereby forming a first output signal;
    a comparison apparatus having a first input terminal, a second input terminal and a first output terminal, wherein the first input terminal is configured to receive the first output signal, the second input terminal is configured to receive the step signal, the first output terminal is configured to output a second output signal;
    a multiplier having a third input terminal, a fourth input terminal and a second output terminal, wherein the third input terminal is configured to receive the second output signal, the fourth input terminal is configured to receive a first clock signal, the second output terminal is configured to output a third output signal; and
    a counting apparatus configured to receive the third output signal, count the number of pulses of the third output signal, and generate a digital code accordingly.

2. The temperature sensor according to claim 1, wherein the first signal delaying apparatus comprises a plurality of cascaded signal delaying units, the first-stage signal delaying unit is configured to receive the step signal, the last-stage signal delaying unit is configured to output the first output signal.

3. The temperature sensor according to claim 2, wherein each signal delaying unit is an inverter and each inverter comprises:
    a p-type transistor configured to have its one source/drain electrically connected to a voltage source, its another source/drain referred to as an output terminal of the inverter, and its gate referred to as an input terminal of the inverter; and
    an n-type transistor configured to have its one source/drain electrically connected to the output terminal of the inverter, its another source/drain electrically connected to a reference voltage, and its gate electrically connected to the input terminal of the inverter.

4. The temperature sensor according to claim 2, wherein each signal delaying unit comprises:
    a first p-type transistor configured to have its one source/drain electrically connected to a voltage source, and its gate referred to as an input terminal of the signal delaying unit;
    a first n-type transistor configured to have its one source/drain electrically connected to another source/drain of the first p-type transistor, its another source/drain electrically connected to a reference voltage, and its gate electrically connected to the input terminal of the signal delaying unit;
    a second p-type transistor configured to have its one source/drain electrically connected to the voltage source, and its gate electrically connected to another source/drain of the first p-type transistor;
    a second n-type transistor configured to have its one source/drain electrically connected to the reference voltage, and its gate electrically connected to another source/drain of the first p-type transistor;
    a third n-type transistor configured to have its one source/drain electrically connected to the gate of the second p-type transistor, and its gate electrically connected to another source/drain of the second p-type transistor;

a third p-type transistor configured to have its one source/drain electrically connected to another source/drain of the third n-type transistor, its another source/drain electrically connected to the gate of the second n-type transistor, and its gate electrically connected to another source/drain of the second n-type transistor;

a fourth p-type transistor configured to have its one source/drain electrically connected to another source/drain of the second p-type transistor, its another source/drain referred to as an output terminal of the signal delaying unit, and its gate electrically connected to another source/drain of the third n-type transistor; and a fourth n-type transistor configured to have its one source/drain electrically connected to the output terminal of the signal delaying unit, its another source/drain electrically connected to the gate of the third p-type transistor, and its gate electrically connected to another source/drain of the third n-type transistor.

5. The temperature sensor according to claim 2, wherein each signal delaying unit comprises:

a first p-type transistor configured to have its one source/drain electrically connected to a voltage source, and its gate referred to as an input terminal of the signal delaying unit;

a first n-type transistor configured to have its one source/drain electrically connected to another source/drain of the first p-type transistor, its another source/drain electrically connected to a reference voltage, and its gate electrically connected to the input terminal of the signal delaying unit;

a second p-type transistor configured to have its one source/drain electrically connected to the voltage source, and its gate electrically connected to another source/drain of the first p-type transistor;

a second n-type transistor configured to have its one source/drain electrically connected to the reference voltage, and its gate electrically connected to another source/drain of the first p-type transistor;

a third n-type transistor configured to have its one source/drain electrically connected to the gate of the second p-type transistor, and its gate electrically connected to another source/drain of the second p-type transistor;

a third p-type transistor configured to have its one source/drain electrically connected to another source/drain of the third n-type transistor, its another source/drain electrically connected to the gate of the second n-type transistor, and its gate electrically connected to another source/drain of the second n-type transistor;

a fourth p-type transistor configured to have its one source/drain electrically connected to another source/drain of the second p-type transistor, and its gate electrically connected to another source/drain of the third n-type transistor and referred to as an output terminal of the signal delaying unit; and a fourth n-type transistor configured to have its one source/drain electrically connected to another source/drain of the fourth p-type transistor, its another source/drain electrically connected to the gate of the third p-type transistor, and its gate electrically connected to the output terminal of the signal delaying unit.

6. The temperature sensor according to claim 1, further comprising a second signal delaying apparatus configured to receive a second clock signal, perform a phase delay operation on the received second clock signal, and thereby forming the first clock signal, wherein the rising edge of one pulse of the first clock signal is correspondingly located at the rising edge of the pulse of the second output signal.

7. The temperature sensor according to claim 1, further comprising a step signal generation apparatus configured to provide the step signal.

8. The temperature sensor according to claim 7, further comprising a second signal delaying apparatus configured to receive a second clock signal, perform a phase delay operation on the received second clock signal, and thereby forming the first clock signal, wherein the rising edge of one pulse of the first clock signal is correspondingly located at the rising edge of the pulse of the second output signal.

9. The temperature sensor according to claim 1, wherein the second output signal has a logic-low level if the first and second input terminals of the comparison apparatus have the same logic level, and the second output signal has a logic-high level if the first and second input terminals of the comparison apparatus have different logic levels.

10. The temperature sensor according to claim 9, wherein the comparison apparatus comprises an XOR logic operation apparatus.

11. The temperature sensor according to claim 10, wherein the XOR logic operation apparatus comprises an XOR gate, the two input terminals of the XOR gate are referred to as the first input terminal and the second input terminal, respectively, and the output terminal of the XOR gate is referred to as the first output terminal.

12. The temperature sensor according to claim 1, wherein the third output signal has a logic-low level if at least one of the third input terminal and the fourth input terminal of the multiplier has a logic-low level, and the third output signal has a logic-high level if both the third input terminal and the fourth input terminal of the multiplier have a logic-high level.

13. The temperature sensor according to claim 12, wherein the comparison apparatus comprises an AND logic operation apparatus.

14. The temperature sensor according to claim 13, wherein the AND logic operation apparatus comprises an AND gate, the two input terminals of the AND gate are referred to as the third input terminal and the fourth input terminal, respectively, and the output terminal of the AND gate is referred to as the second output terminal.

* * * * *